United States Patent
Tagishi

(10) Patent No.: US 7,519,087 B2
(45) Date of Patent: Apr. 14, 2009

(54) FREQUENCY MULTIPLY CIRCUIT USING SMD, WITH ARBITRARY MULTIPLICATION FACTOR

(75) Inventor: Mitsuaki Tagishi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 821 days.

(21) Appl. No.: 11/153,319

(22) Filed: Jun. 16, 2005

(65) Prior Publication Data

US 2005/0282511 A1  Dec. 22, 2005

(30) Foreign Application Priority Data

Jun. 18, 2004  (JP) ............................. 2004-181737

(51) Int. Cl.
*H04J 3/06* (2006.01)
(52) U.S. Cl. ...................... 370/517; 327/161
(58) Field of Classification Search ............... 327/141, 327/158, 161, 253, 271, 277, 284, 291–298; 370/350, 503–520; 375/353–376
See application file for complete search history.

(56) References Cited

U.S. PATENT DOCUMENTS 6,005,421 A * 12/1999 Saeki .......................... 327/119
6,101,197 A * 8/2000 Keeth et al. ................. 370/517
6,222,408 B1 * 4/2001 Saeki ........................... 327/271
6,727,740 B2 * 4/2004 Kirsch ......................... 327/161

FOREIGN PATENT DOCUMENTS

| JP | 10-303713 | 11/1998 |
| JP | 10-335994 | 12/1998 |
| JP | 3434682 | 5/2003 |

* cited by examiner

*Primary Examiner*—Chirag G Shah
*Assistant Examiner*—Otis L Thompson, Jr.
(74) *Attorney, Agent, or Firm*—McGinn IP Law Group, PLLC

(57) ABSTRACT

Disclosed is a frequency multiply circuit for outputting an output signal obtained by variably multiplying the frequency of an input signal includes a synchronous delay circuit, a multiplexing circuit, and a control circuit. The synchronous delay circuit includes a period measuring delay circuit for measuring the period of the input signal and delay reproducing delay circuits each with a delay time thereof variably set based on the period measured by the period measuring delay circuit, for respectively reproducing the delay time. The multiplexing circuit receives a plurality of signals of different phases output from the synchronous delay circuits, for multiplexing. The control circuit variably sets the number of the delay stages of the period measuring delay circuit and the numbers of the stages of the delay reproducing delay circuits, according to the set frequency-multiplication factor. The output signal synchronized with the input signal and obtained by multiplying the frequency of the input signal is output from the multiplexing circuit.

9 Claims, 7 Drawing Sheets

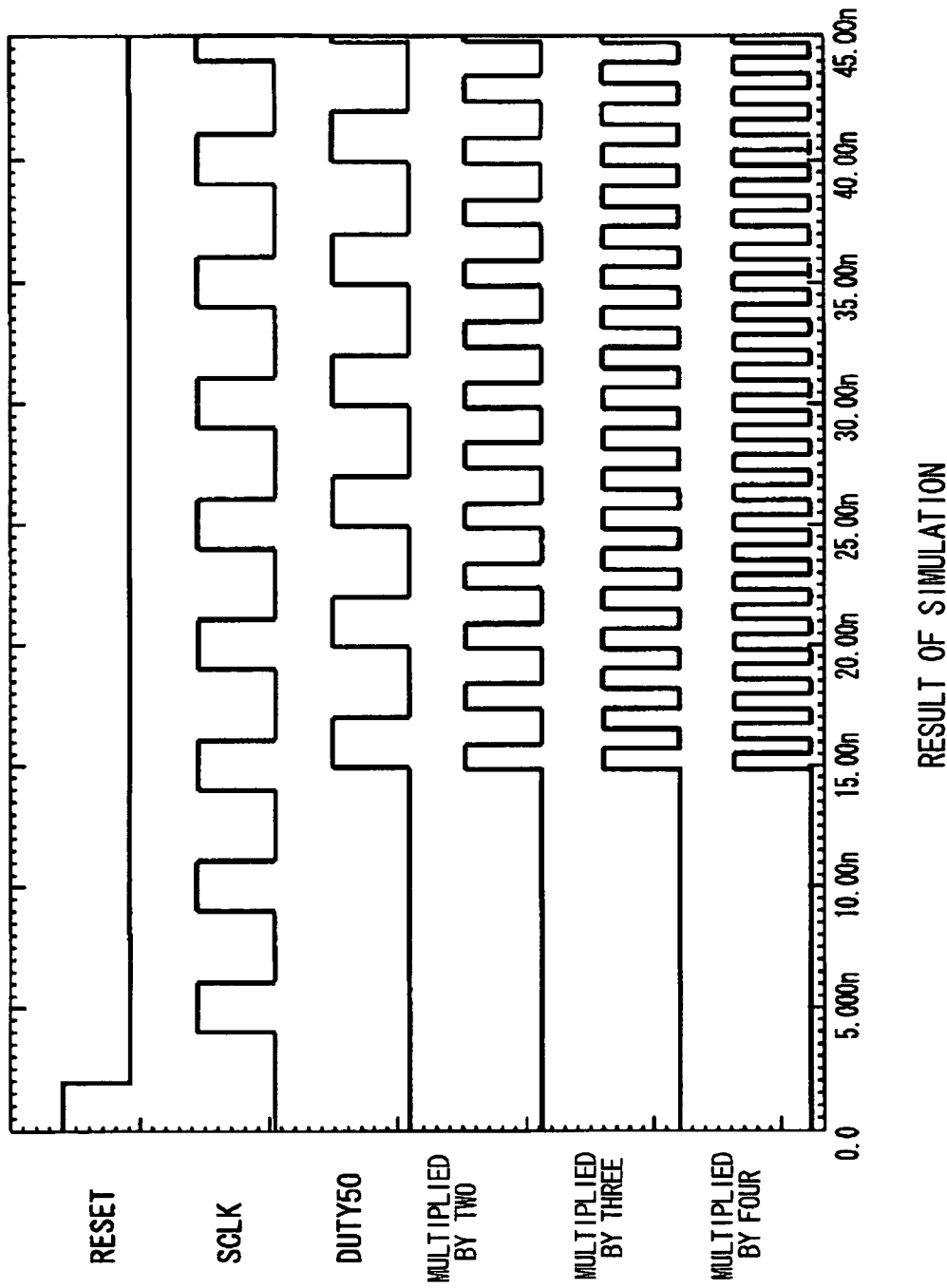

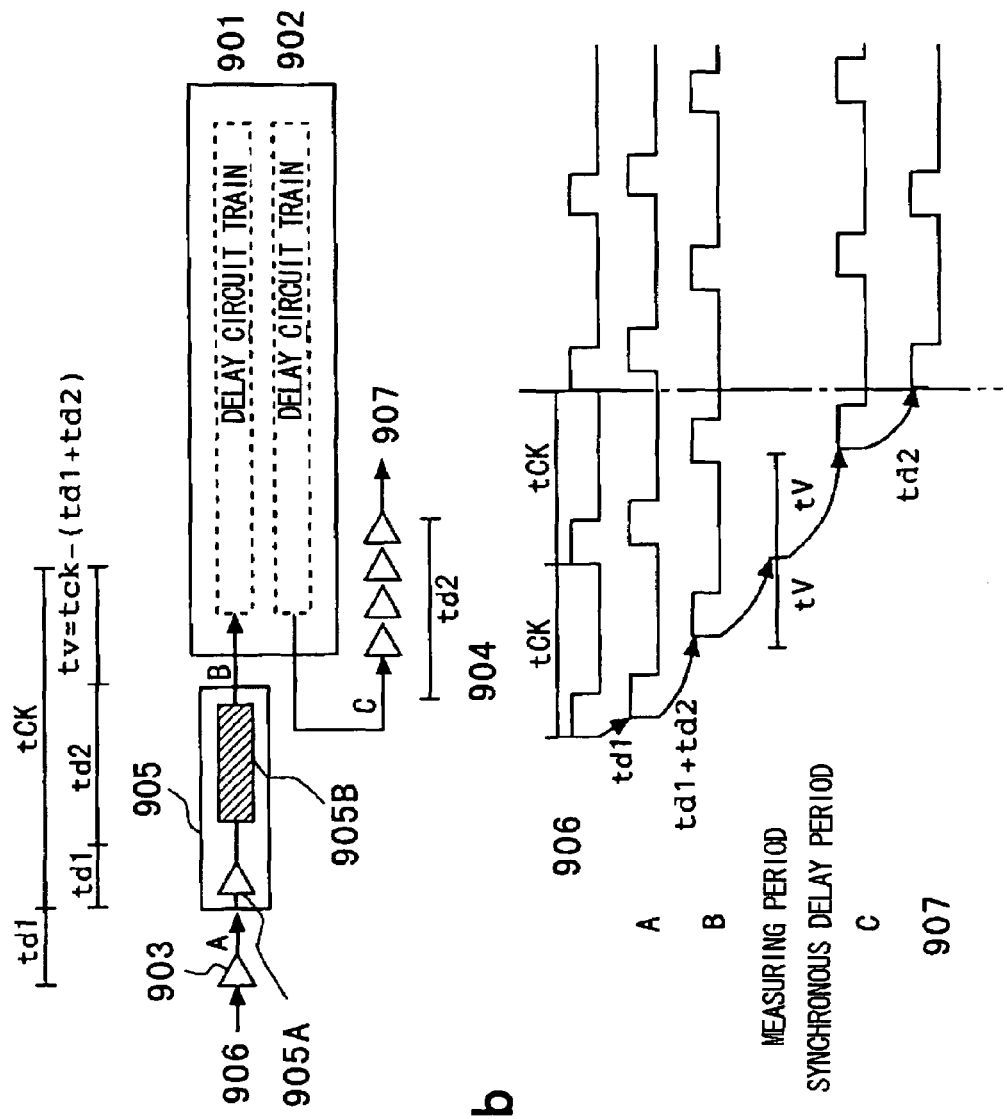

US 7,519,087 B2

FREQUENCY MULTIPLY CIRCUIT USING SMD, WITH ARBITRARY MULTIPLICATION FACTOR

FIELD OF THE INVENTION

The present invention relates to a frequency multiply circuit. More specifically, the invention relates to the frequency multiply circuit that uses a synchronous delay circuit.

BACKGROUND OF THE INVENTION

As conventional frequency multiply circuits, a configuration provided with a PLL (Phase Locked Loop) circuit or a DLL (Delay Locked Loop) circuit is employed. As is well known, the PLL circuit includes a phase comparator, a charge pump for converting the result of comparison by the phase comparator to a voltage, a loop filter for smoothing the output of the charge pump, and a VCO (voltage-controlled oscillator) for receiving a DC voltage from the loop filter as a control voltage and changing an oscillation frequency according to the control voltage. A frequency divider is provided in a feedback path between the output terminal of the VCO and the input terminal of the phase comparator, and the phase of a frequency-divided clock signal obtained by frequency dividing the output clock signal of the VCO by the frequency divider is compared with the phase of an input clock signal by the phase comparator. As described above, the frequency multiply circuit that uses the PLL circuit includes the phase comparator, which makes phase comparison with the waveform of an input signal. Thus, it requires time to achieve locking. As the frequency multiply circuit that uses the delay circuit (DLL) and includes the phase comparator, a description in Patent Document 1 is referred to.

FIGS. 7a and 7b show examples of a configuration of a conventional synchronous delay circuit (Synchronous Mirror Delay Circuit; also referred to as an "SMD") (refer to Patent Document 2). As shown in FIG. 7a, the synchronous delay circuit includes an input buffer 903 (with a delay time thereof being td1), a dummy delay circuit 905 constituted from an input buffer dummy 905A (with a delay time thereof being td1) and a clock driver dummy 905B (with a delay time thereof being td2), a delay circuit line 901, a delay circuit line 902, and a clock driver 904 (with a delay time thereof being td2). The input buffer 903 receives an external clock signal. The delay circuit line 901 receives the output of the dummy delay circuit 905. When the clock signal input to the delay circuit line 901 has traveled a distance equivalent to one clock period, the clock signal is transferred to the delay circuit line 902 via a transfer circuit not shown. The signal propagates through the delay circuit line 902 in a direction opposite to that in the delay circuit line 901. The clock driver 904 receives the output of the delay circuit line 902. The clock driver 904 receives the output of the delay circuit line 902. The delay circuit line 901 is the delay circuit for period measurement, which measures one clock period of the clock signal. The delay circuit line 902 is the delay circuit for reproducing the delay time measured by the delay circuit line 901.

As shown in FIG. 7b, an external clock 906 (with a period thereof being tCK) propagates through the delay circuit line 901 for a time tV=tCK−(td1+td2), and is transferred to the delay circuit line 902. The external clock 906 propagates through the delay circuit line for the tV in a direction opposite to that in the delay circuit line 901, for output. Then, the external clock 906 is output from the clock driver 904 as an internal clock 907. After td1+td1+td2+2×{[tCK−(td1+td2)]+td2=2×tCK (two clock periods), the internal clock 907 is output. That is, the internal clock signal 907 delayed by twice the clock period tCK and synchronized with the external clock signal 906 is output.

As a frequency multiply circuit having a configuration provided with a plurality of the delay reproducing delay circuits of the synchronous delay circuit (indicated by reference numeral 902 in FIG. 7a), a description in Patent Document 3, which will be described hereinafter, is also referred to.

[Patent Document 1]
    JP Patent Kokai Publication No. JP-A-10-335994 (FIGS. 1 and 5)

[Patent Document 2]
    JP Patent No. 3434682 (FIG. 15)

[Patent Document 3]
    JP Patent Kokai Publication No. JP-A-10-303713 (FIG. 1)

SUMMARY OF THE DISCLOSURE

As described above, the frequency multiply circuit that uses the PLL circuit or the DLL circuit includes a feedback configuration, includes the phase comparator, and performs phase comparison with the input signal waveform. Thus, the frequency multiply circuit has a problem that it requires time to achieve locking.

The invention disclosed in this application is generally configured as follows:

A variable frequency multiply circuit in accordance with one aspect of the present invention, which outputs an output signal obtained by multiplying the frequency of an input signal, includes:

a synchronous delay circuit having a period measuring delay circuit for measuring the period of the input signal and a plurality of delay reproducing delay circuits each with a delay time thereof variably set according to a frequency-multiplication factor and based on the period of the input signal measured by the period measuring delay circuit, for respectively delaying the input signal by the set delay time, for output;

a multiplexing circuit for receiving a plurality of signals of different phases output from the synchronous delay circuit, for multiplexing; and a control circuit for variably setting a ratio among the number of the delay stages of the period measuring delay circuit and the numbers of the delay stages of the plurality of delay reproducing delay circuits according to the set frequency-multiplication factor. The output signal obtained by multiplying the frequency of the input signal is output from the multiplexing circuit.

The variable frequency multiply circuit includes in accordance with the one aspect of the present invention:

a first delay circuit for period measurement, for measuring the period of the input signal;

a second delay circuit with a delay time thereof variably set according to a frequency-multiplication factor and based on the period of the input signal measured by the first delay circuit, for delaying the input signal just by the set delay time, for output;

a first multiplexing circuit for multiplexing the input signal and the output signal of the second delay circuit, for output;

a third delay circuit with a delay time thereof variably set according to the frequency-multiplication factor and based on the period of the input signal measured by the first delay circuit, for delaying the output signal of the first multiplexing circuit just by the set delay time, for output;

a second multiplexing circuit for multiplexing the output signal of the first multiplexing circuit and the output signal of the third delay circuit, for output; and a control circuit for variably setting a ratio among the numbers of the delay stages of the first through third delay circuits according to the set frequency-multiplication factor.

The present invention may further include one or more sets of:

an (n+1)th delay circuit (n being an integer equal to or larger than three), with a delay time thereof variably set according to the frequency-multiplication factor and based on the period of the input signal measured by the first delay circuit, for delaying the output signal of an (n−1)th multiplexing circuit (n being the integer equal to or larger than three) just by the set delay time, for output; and an nth multiplexing circuit (n being the integer equal to or larger than three) for multiplexing the output signal of the (n−1)th multiplexing circuit and the output signal of the (n+1) th delay circuit, for output.

The meritorious effects of the present invention are summarized as follows.

According to the present invention, a delay set value of each of the delay reproducing variable delay circuits is set according to the frequency-multiplication factor, responsive to the period of an input clock measured by the period measuring delay circuit. Thus, a multiplied signal synchronized with the input clock can be generated.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 6 is a timing waveform diagram showing a result of simulation according to the embodiment of the present invention; and FIGS. 7a and 7b are diagrams showing a configuration of a conventional synchronous delay circuit.

PREFERRED EMBODIMENTS OF THE INVENTION

Figure 1:
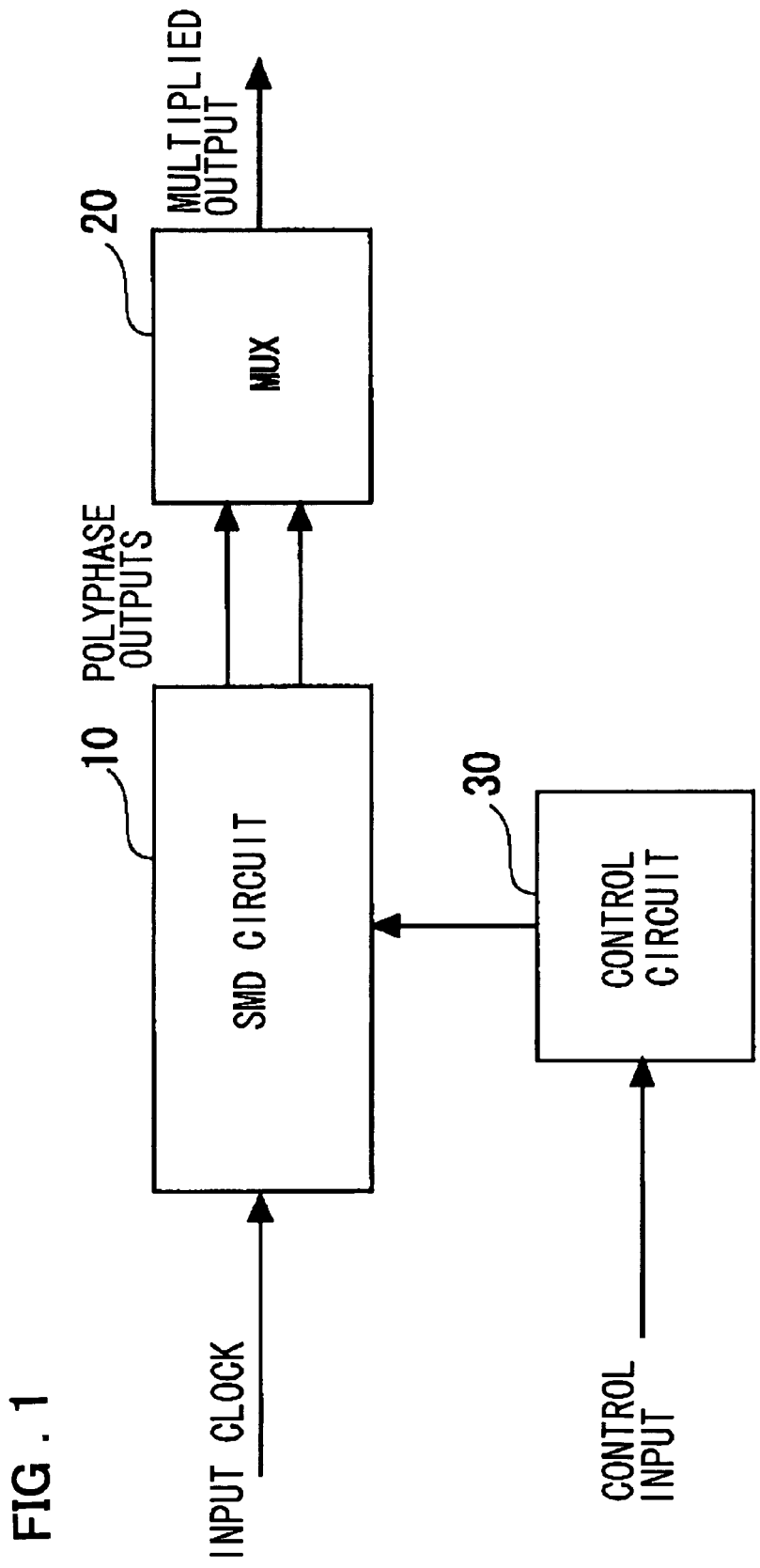
FIG. 1 is a block diagram showing a configuration of an embodiment of the present invention.

The preferred embodiments of the present invention will be described. FIG. 1 is a block diagram showing a configuration of an embodiment of the present invention. Referring to FIG. 1, a circuit according to the present embodiment includes a synchronous delay circuit 10, a multiplexing circuit (multiplexer) 20, and a control circuit 30.

The synchronous delay circuit 10 (Synchronous Mirror Delay Circuit: also referred to as an "SMD") includes a period measuring delay circuit for measuring one clock period of an input clock signal and a plurality of delay reproducing delay circuits each with a delay time thereof variably set based on the period measured by the period measuring delay circuit, for respectively reproducing the delay time.

The control circuit 30 variably performs setting of the number of delay stages of the period measuring delay circuit and the number of 20 stages of the delay reproducing delay circuits in the synchronous delay circuit 10, according to a frequency-multiplication factor. The multiplexing circuit 20 receives a plurality of signals (multi-phase outputs), phases of which are different from each other and are output from the synchronous delay circuit 10, multiplexes the signals, and outputs a 25 multiplied signal.

From the multiplexing circuit 20, an output signal obtained by multiplying the frequency of the input clock signal is output. The arbitrary frequency-multiplication factor is implemented by control from the control circuit 30. The basic configuration of the synchronous delay circuit includes the delay circuit for measuring the period of the input clock signal and a plurality of the delay reproducing delay circuits according to a configuration described with reference to FIGS. 7a and 7b, for example. According to the present embodiment, the multiplied signal synchronized with the input clock signal (of which the phase is synchronized with the input clock signal for each period of cycles the number of which is equal to the frequency-multiplication factor) is output from the multiplexing circuit 20. The embodiment of the present invention will be given in more detail.

Figure 2:
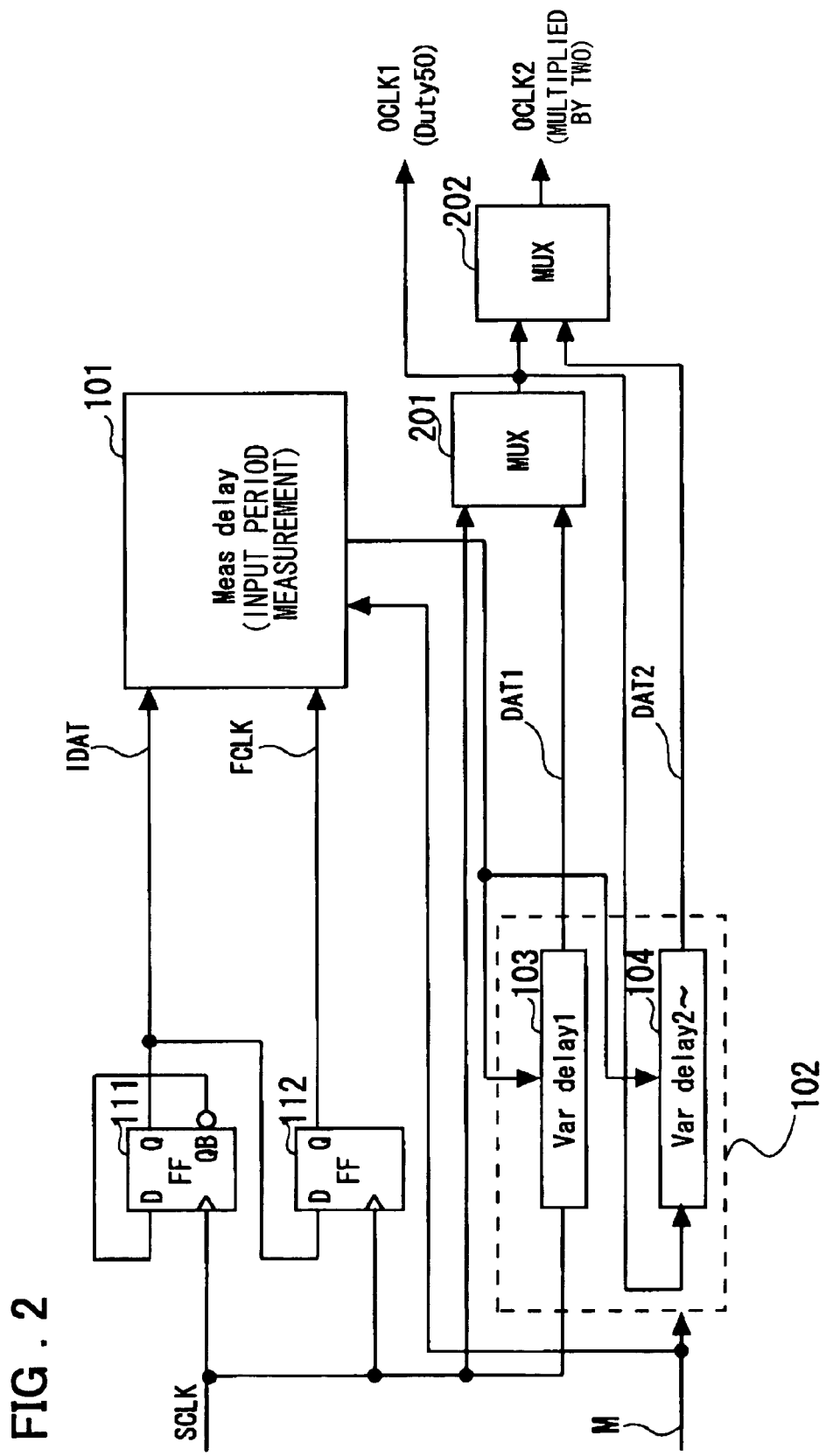
FIG. 2 is a diagram showing a configuration of an embodiment of the present invention.

FIG. 2 is a diagram showing a configuration of an embodiment of the present invention. Referring to FIG. 2, a frequency multiply circuit according to the embodiment of the present invention includes D-type flip-flops 111 and 112, an input period measuring delay circuit 101, a first variable delay circuit (Var delay1) 103, a first multiplexing circuit 201, a second variable delay circuit (Var delay2) 104, and a second multiplexing circuit 202. In the D-type flip-flop 111, an input clock signal SCLK is input to the clock input terminal of the D-type flip-flop 111, a data input terminal D of the D-type flip-flop 111 is feedback connected to an inverted data output terminal QB of the D-type flip-flop 111, and a clock IDAT frequency divided by two is output from a non-inverting data output terminal Q of the D-type flip-flop 111. In the D-type flip-flop 112, a data input terminal D is connected to the non-inverting data output terminal Q of the D-type flip-flop 111, the input clock signal SCLK is input to the clock terminal of the D-type flip-flop 112, and a clock signal FCLK frequency divided by two is output from a non-inverting data output terminal Q of the D-type flip-flop 112. The input period measuring delay circuit (Measure Delay: also referred to as a "Meas delay") 101 receives outputs from the D-type clip-flops 111 and 112 and measures the period of the clock signal SCLK. The first variable delay circuit (Var delay1) 103 outputs a signal DAT1 obtained by delaying the input clock signal SCLK just by 180 degrees in phase based on a signal from the input period measuring delay circuit 101. The first multiplexing circuit 201 receives the input clock signal SCLK and the output signal DAT1 from the first variable delay circuit 103 for multiplexing and outputs an output signal OCLK1 with a duty of 50%. The second variable delay circuit (Var delay2) 104 receives the output signal OCLK1 of the first multiplexing circuit 201, and outputs a signal DAT2 obtained by delaying the OCLK1 just by 90 degrees in phase based on the signal from the input period measuring delay circuit 101. The second multiplexing circuit 202 receives the output signal OCLK1 from the first multiplexing circuit 201 and the output signal DAT2 from the second variable delay circuit 104 for multiplexing, and outputs an output signal OCLK2. The variable delay circuit (Var delay1) 103 and the variable delay circuit (Var delay2⁻) 104 in FIG. 2 constitute a delay reproducing delay circuit 102. The input period measuring delay circuit 101 and the delay reproducing delay circuit 102 constitutes the synchronous delay circuit (SMD) 10 in FIG. 1. Referring to FIG. 2, the variable delay circuit (Var delay2⁻) indicates that a variable delay circuit (Var delay3) and a variable delay circuit (Var delay4) and the like are disposed as necessary, in addition to the variable delay circuit (Var delay2).

In the present embodiment, under control of the control circuit 30 (refer to FIG. 1), a control signal (M) for controlling a set ratio among the number of the delay stages of the input period measuring delay circuit 101, the number of the delay stages of the variable delay circuit 103, and the number of the delay stages of the variable delay circuit 104 according to the set frequency-multiplication factor is supplied. The numbers of the delay stages of the variable delay circuits 103 and 104 are variably set according to the period (the number of the delay stages equivalent to one clock period) of the input clock signal SCLK measured by the delay circuit 101 and the set ratio of the numbers of the delay stages responsive to the set frequency-multiplication factor.

When the frequency-multiplication factor is two, for example, the ratio among the number of the delay stages of the period measuring delay circuit 101, the number of the delay stages of the first variable delay circuit 103, and the number of the delay stages of the second variable delay circuit 104 (accordingly the ratio of delay times) is set to 8:4:2 in terms of an inverter (a CMOS inverter) that constitutes the delay circuits. (two inverters constitute a non-inverting buffer, thus becoming a delay unit.) Accordingly, when one period of the input clock signal SCLK measured by the period measuring delay circuit 101 is equivalent to 32 stages of inverters that constitute the delay circuit 101, the numbers of the delay stages of the first and second variable delay circuits 103 and 104 are set to 16 and 8, respectively.

According to the configuration described above in this embodiment, a plurality of signals multiplied by mutually different frequency-multiplication factors can be output, using the same circuit configuration. The period of the input clock signal SCLK is set to be arbitrary. The period of the input clock signal SLCK may be changed. In this case, too, a frequency-multiplied signal synchronized with the input clock signal SCLK is output. That is, the frequency-multiplied signal is synchronized with the input clock signal SCLK for a period of cycles the number of which is equal to the frequency-multiplication factor.

Figure 3:
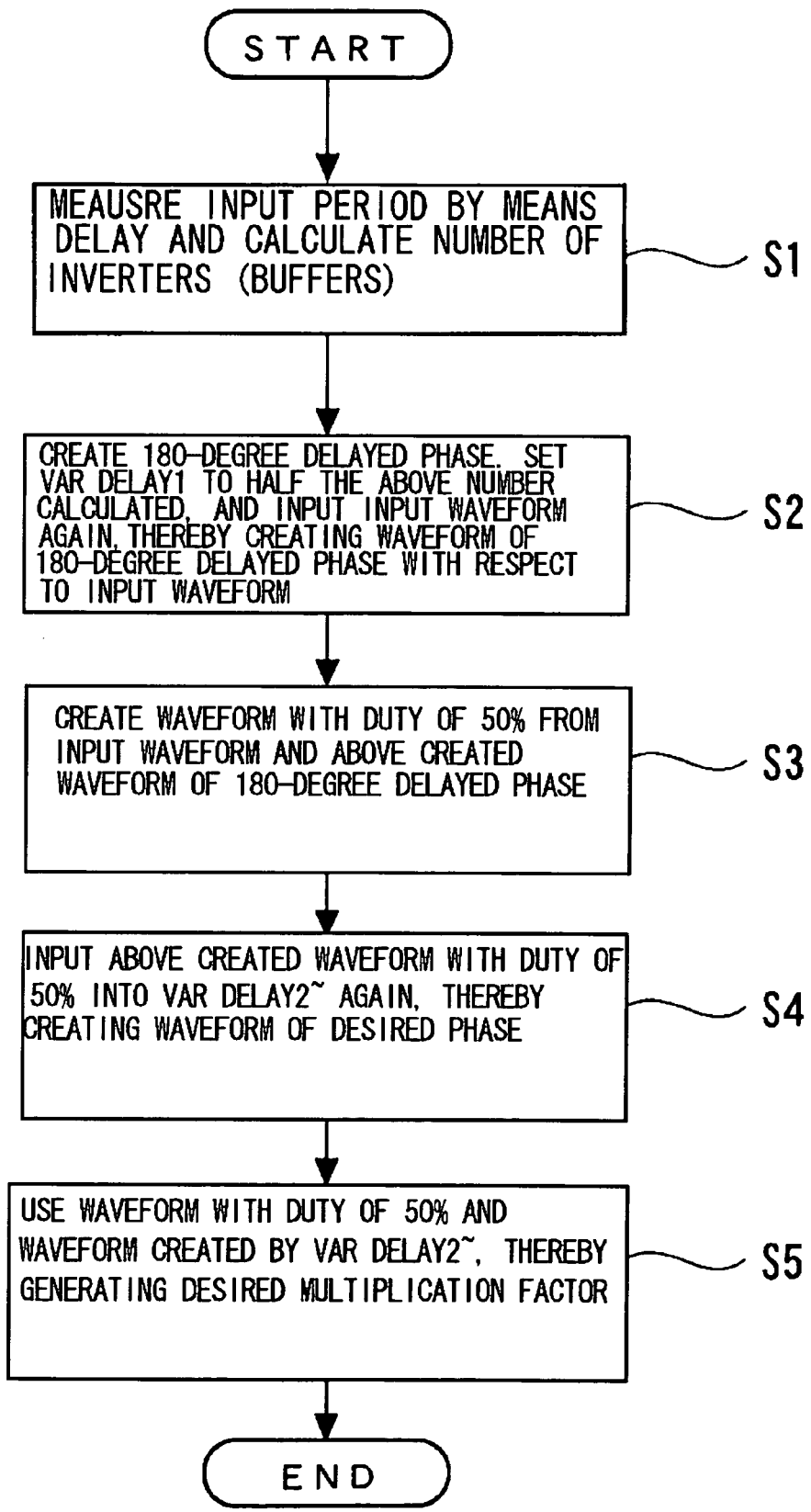
FIG. 3 is a flow chart for explaining an operation of the embodiment of the present invention.

FIG. 3 is a flowchart for explaining a processing operation of the present invention. The operation of the first embodiment of the present invention will be described with reference to FIGS. 2 and 3.

One period of the input clock signal SCLK is measured by the period measuring delay circuit 101, and the number of the inverters (buffers) in the delay circuits equivalent to the one period is calculated (at step S1).

A signal delayed by 180 degrees in phase with respect to an edge of the input clock signal SCLK is generated (at step S2). When a signal multiplied by two is generated, for example, and the number of the stages of the inverters at the period measuring delay circuit obtained through measurement of the one clock period of the input clock signal SCLK is 16, the number of delay stages (in terms of the inverter) of the variable delay circuit 103 for generating the delay of 180 degrees is set to eight. The input clock signal SCLK is then input to the variable delay circuit 103, so that a waveform delayed by 180 degrees in phase is generated.

When the input clock signal SCLK has propagated through the period measuring delay circuit 101 to reach a distance equivalent to the one period thereof, the input clock signal SCLK may be output from a transfer circuit not shown (refer to Patent Document 3 described before), and may be transferred and input to the variable delay circuit 103 at a position where the clock signal SCLK has traveled the distance equivalent to a half of the number of the stages of delay elements equivalent to the one period. Then, a signal delayed by a time equivalent to eight delay stages may be output from the output terminal of the delay circuit 103.

Next, using the input clock signal SCLK and the waveform from the variable delay circuit 103, delayed by 180 degrees, the signal DAT1 with the duty of 50% is output (at step S3).

Then, the generated signal DAT1 with the duty of 50% is again input to the variable delay circuit (Var delay2⁻) 104 and the subsequent ones, thereby generating the waveform of a desired phase (at step S4). When the signal multiplied by two is generated, for example, and when the number of the inverters obtained through the measurement of the one clock period of the input clock signal SCLK by the period measuring delay circuit 101 is 16, the number of the stages of delay units of the variable delay circuit 104 is set to four if the delay of 90 degrees is generated by the variable delay circuit 104.

Incidentally, when the input clock signal SCLK has propagated through the period measuring delay circuit 101 to reach a distance equivalent to the one period, the input clock signal SCLK may be output from the transfer circuit not shown (refer to the Patent Document 3 described before), and may be transferred and input to the variable delay circuit 103 at a position where the clock signal SCLK has traveled the distance equivalent to a quarter of the number of the stages of the delay elements equivalent to the one period. Then, a signal delayed by a time equivalent to four delay stages may be output from the output terminal of the variable delay circuit 103.

Using the signal DAT1 with the duty of 50% and the waveform generated through the variable delay circuit 104, the desired frequency-multiplication factor is generated (at step S5).

Figure 4:
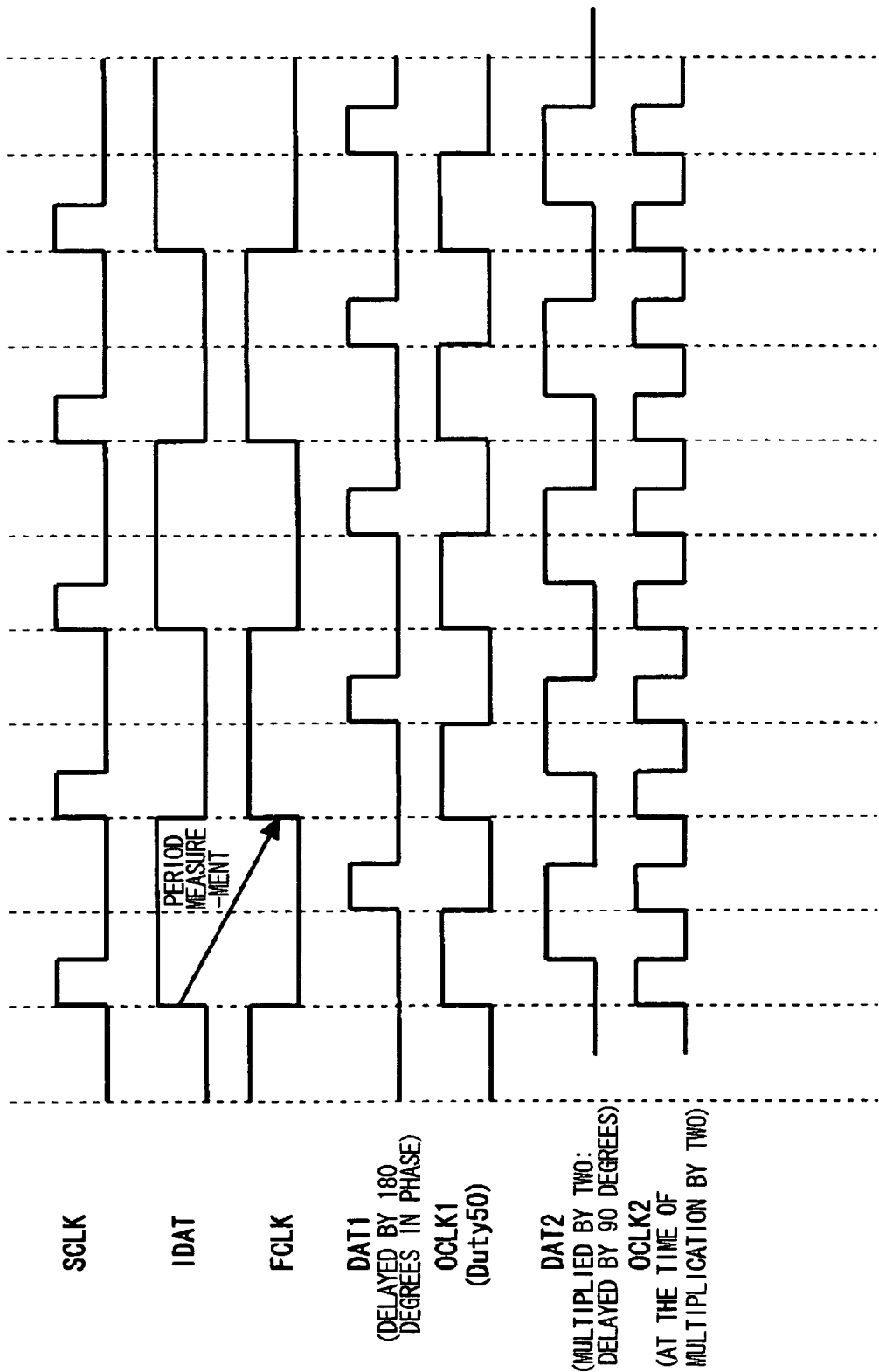
FIG. 4 is a timing diagram explaining the operation of the embodiment of the present invention.

FIG. 4 is a timing diagram showing the operation of the embodiment of the present invention illustrated in FIG. 2. FIG. 4 shows timing waveforms of the signals (SCLK, IDAT, FCLK, DAT1, OCLK1, DAT2 and OCLK2) when the clock signal obtained by multiplying the input clock signal by two is generated. In the case of the frequency-multiplication by two, the ratio among the number of the stages of the inverters (CMOS inverters) that constitute the delay elements of the input period measuring delay circuit 101, the number of the stages of the inverters (CMOS inverters) of the variable delay circuit 103, and the number of the stages of the inverters (CMOS inverters) of the variable delay circuit 104 is set to 8:4:2. In the case of the frequency-multiplication by two, the Vari delay2 of the variable delay circuit 104 is employed. However, the Var delay3 and the subsequent variable delay circuits are not employed.

From the signals IDAT and FCLK obtained by frequency dividing the input clock signal SCLK by two, the period of the input clock signal SCLK is measured. The number of the inverters in the input period measuring delay circuit 101, through which the rising edge of the signal IDAT input to the input period measuring delay circuit 101 has passed till the timing of the falling edge of the signal FCLK is equivalent to the period of the input clock signal SCLK.

The signal DAT1 is the signal obtained by delaying the input clock signal SCLK by 180 degrees in phase. The first multiplexing circuit 201 that inputs the input clock signal SCLK and the signal DAT1 outputs the signal OCLK1 (with the duty of 50%) that rises at the rising edge of the input clock signal SCLK and falls at the rise of the signal DAT1.

The signal DAT2 output from the variable delay circuit 104 is the signal delayed from the input clock signal SCLK by 90 degrees in phase. The second multiplexing circuit 202 outputs the signal OCLK2 (clock multiplied by two) that rises at the rising edge of the signal OCLK1 and falls at the rise of the signal DAT2.

According to this embodiment, even when the period of the input clock is changed due to a skew or the like, the clock multiplied by two which is synchronized with the input clock signal SCLK and which tracks a variation in the period of the input clock SCLK is output as the frequency-multiplied signal OCLK2. Further, by the control signal M, the arbitrary frequency-multiplication factor is set.

Figure 5:
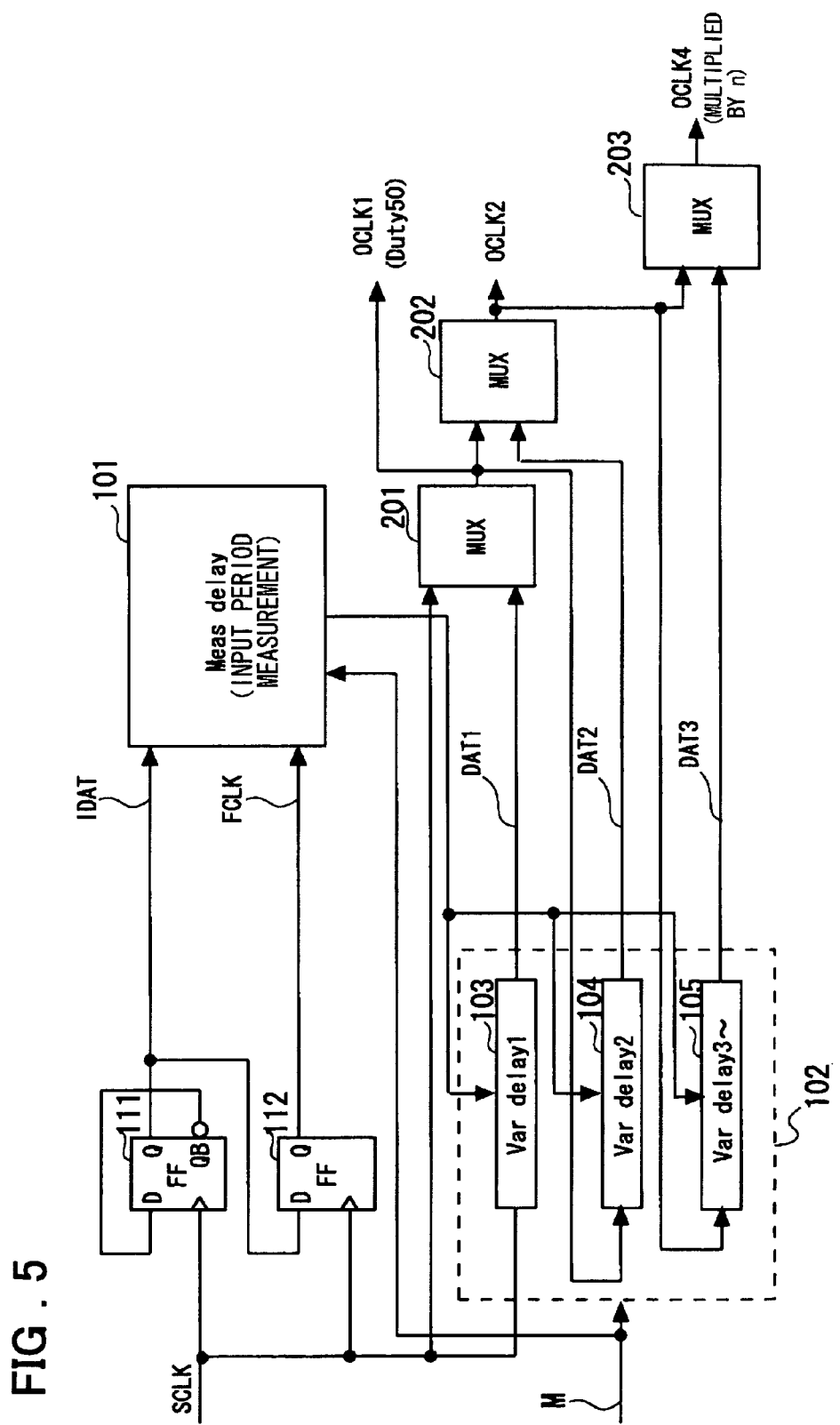
FIG. 5 is a diagram showing a configuration of other embodiment of the present invention.

FIG. 5 is a diagram showing a configuration of an embodiment for generating a clock multiplied by four. Referring to FIG. 5, the delay reproducing delay circuit 102 in a frequency multiply circuit in this embodiment includes a third variable delay circuit (Var delay3) 105 that receives the clock signal OCLK2 multiplied by two from the second multiplexing circuit 202, thereby generating a signal delayed by 45 degrees in phase, in addition to the configuration in FIG. 2. Further, a third multiplexing circuit 203 for multiplexing the clock signal OCLK2 multiplied by two from the second multiplexing circuit 202 and an output signal DAT3 from the third variable delay circuit 105 is provided, and a clock signal OCLK4 multiplied by four is generated from the third multiplexing circuit 203. By adding the variable delay circuit and the multiplexing circuit in the same manner, the clock multiplied by the arbitrary frequency-multiplication factor can be generated. Incidentally, in the configuration in FIG. 5, the ratio among the delay times of the delay circuits 101, 103, 104, and 105 is set to 16:8:4:2 in terms of the inverter.

FIG. 6 is a diagram showing a result of simulation of the circuit in the embodiment of the present invention shown in FIG. 2 or FIG. 5. A signal RESET is made to be active at a high level, thereby resetting the flip-flops. A DUTY 50 is the OCLK1 in FIGS. 2 and 5. Multiplication by two is performed on the OCLK2 in FIG. 1. The signal RESET in FIG. 6 is a reset signal for initialization of an operation, and resets the D-type flip-flops 111, 112, and the like in FIGS. 2 and 5. Referring to FIG. 6, the configurations described with reference to FIGS. 2 and 5 are employed for frequency-multiplication by two and frequency-multiplication by four, respectively.

Generation of a clock multiplied by three will be described. In this case, the first variable delay circuit 103 in FIG. 5 generates a signal delayed by 180 degrees in phase. The second variable delay circuit 104 outputs a signal obtained by delaying the OCLK1 by 120 degrees in phase. The second multiplexing circuit 202 multiplexes the OCLK1 and DAT2 into the OCLK2. The third variable delay circuit 105 inputs the OCLK2 and generates the signal DAT3 delayed by 60 degrees in phase. The third multiplexing circuit 203 multiplexes the OCLK2 and the signal DAT3 obtained by delaying the OCLK2 by 60 degrees in phase, so that the clock multiplied by three is generated. The ratio among the delay times of the delay circuits 101, 103, 104, 105 is set to 12:6:4:2 in terms of the number of the stages of the inverters.

Incidentally, in addition to the frequency-multiplication factors of two, three, and four described above, the clock signal multiplied by the arbitrary frequency-multiplication factor can be generated based on multi-phase clocks generated by the synchronous delay circuit. In this embodiment, the clock signal multiplied by the arbitrary frequency-multiplication factor can be generated without using the PLL circuit. This embodiment has no jitter specific to a feedback configuration such as the PLL circuit and is made to be suitable for being applied to a clock frequency multiply circuit in a semiconductor integrated circuit device.

The foregoing description was given in connection with the embodiments described above. The present invention, however, is not limited to the configurations of the embodiments described above, and includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A frequency multiply circuit comprising:
   a synchronous delay circuit including a period measuring delay circuit for measuring a period of an input signal and a plurality of delay reproducing delay circuits, each delay reproducing delay circuit having a delay time thereof variably set according to a frequency-multiplication factor and based on the period of the input signal measured by said period measuring delay circuit and delaying the input signal by the set delay time to output the delayed signal;
   a multiplexing circuit, receiving a plurality of signals that have different phases and are output from said synchronous delay circuit, for multiplexing said plurality of signals received; and
   a control circuit for variably setting a ratio among a number of delay stages of said period measuring delay circuit and numbers of delay stages of said plurality of delay reproducing delay circuits 15 according to the frequency-multiplication factor;
   an output signal obtained by multiplying a frequency of the input signal being output from said multiplexing circuit.

2. A frequency multiply circuit with a frequency-multiplication factor thereof capable of being changed, for outputting an output signal obtained by multiplying a frequency of an input signal, comprising:
   a first delay circuit for measuring a period of the input signal;
   a second delay circuit with a delay time thereof variably set according to the frequency-multiplication factor and based on the period of the input signal measured by said first delay circuit, for delaying the input signal just by the set delay time, for output;
   a first multiplexing circuit for multiplexing the input signal and an output signal of said second delay circuit, for output;
   a third delay circuit with a delay time thereof variably set according to the frequency-multiplication factor and based on the period of the input signal measured by said first delay circuit, for delaying an output signal of said first multiplexing circuit just by the set delay time, for output;
   a second multiplexing circuit for multiplexing an output signal of said first multiplexing circuit and an output signal of said third delay circuit, for output; and a control circuit for variably setting a ratio among numbers of delay stages of said first through third delay circuits according to the set frequency-multiplication factor.

3. The frequency multiply circuit according to claim 2, further comprising one or more sets of:
   an (n+1)th delay circuit (n being an integer equal to or larger than three), with a delay time thereof variably set according to the frequency-multiplication factor and based on the period of the input signal measured by said first delay circuit, for delaying an output signal of an (n−1)th multiplexing circuit (where n is the integer equal to or larger than three) just by the set delay time, for output; and
   an nth multiplexing circuit (where n is the integer equal to or larger than three) for multiplexing the output signal of the (n−1)th multiplexing circuit and an output signal of the (n+1)th delay circuit, for output.

4. A frequency multiply circuit with a frequency-multiplication factor thereof capable of being changed, for outputting an output signal obtained by multiplying a frequency of an input signal, comprising:
   a first delay circuit for period measurement, for measuring a period of the input signal;
   a second delay circuit with a delay time thereof variably set according to the frequency-multiplication factor and based on the period of the input signal measured by said first delay circuit, for delaying the input signal just by the set delay time, for output;
   a first multiplexing circuit for multiplexing the input signal and an output signal of said second delay circuit, for output;
   a third delay circuit with a delay time thereof variably set according to the frequency-multiplication factor and based on the period of the input signal measured by said first delay circuit, for delaying an output signal of said first multiplexing circuit just by the set delay time, for output;
   a second multiplexing circuit for multiplexing the output signal of said first multiplexing circuit and an output signal of said third delay circuit, for output;
   a fourth delay circuit with a delay time thereof variably set according to the frequency-multiplication factor and based on the period measured by said first delay circuit, for delaying an output signal of said second multiplexing circuit, for output;
   a third multiplexing circuit for multiplexing the output signal of said second multiplexing circuit and the output signal of said third delay circuit, for output; and
   a control circuit for variably setting a ratio among numbers of delay stages of said first through fourth delay circuits according to the set frequency-multiplication factor.

5. The frequency multiply circuit according to claim 2, wherein in a case of frequency-multiplication by two, the ratio among delay times of said first through third delay circuits is set to 4:2:1.

6. The frequency multiply circuit according to claim 4, wherein in a case of frequency-multiplication by three, the ratio among the delay times of said first through fourth delay circuits is set to 6:3:2:1.

7. The frequency multiply circuit according to claim 4, wherein in a case of frequency-multiplication factor of four, the ratio among the delay times of said first through fourth delay circuits is set to 8:4:2:1.

8. The frequency multiply circuit according to claim 1, wherein the output signal obtained by multiplying the frequency of the input signal is synchronized with the input signal for each period of cycles, a number of the cycles being equivalent to the set frequency-multiplication factor.

9. A semiconductor device including the frequency multiply circuit according to claim 1.

* * * * *